United States Patent
Fujita et al.

(10) Patent No.: US 6,838,405 B2
(45) Date of Patent: Jan. 4, 2005

(54) PLASMA-RESISTANT MEMBER FOR SEMICONDUCTOR MANUFACTURING APPARATUS AND METHOD FOR MANUFACTURING THE SAME

(75) Inventors: Mitsuhiro Fujita, Aichi (JP); Keiji Morita, Kanagawa (JP)

(73) Assignee: Toshiba Ceramics Co., Ltd., Tokyo (JP)

(*) Notice: Subject to any disclaimer, the term of this patent is extended or adjusted under 35 U.S.C. 154(b) by 230 days.

(21) Appl. No.: 10/208,871

(22) Filed: Aug. 1, 2002

(65) Prior Publication Data

US 2003/0034130 A1 Feb. 20, 2003

(30) Foreign Application Priority Data

Aug. 2, 2001 (JP) .......................................... 2001-235188

(51) Int. Cl.⁷ ......................... C04B 35/51; C04B 35/10; C04B 35/03

(52) U.S. Cl. .................... 501/152; 216/108; 156/345.1; 118/723 R

(58) Field of Search ......................... 501/152; 216/108; 156/345.1; 118/723 R

(56) References Cited

U.S. PATENT DOCUMENTS 6,447,937 B1 * 9/2002 Murakawa et al. ......... 428/696

FOREIGN PATENT DOCUMENTS

JP 3145518 1/2001

* cited by examiner

*Primary Examiner*—Elizabeth D. Wood
(74) *Attorney, Agent, or Firm*—Foley & Lardner LLP

(57) ABSTRACT

A plasma-resistant member for a semiconductor manufacturing apparatus, which can reduce the contamination level on a semiconductor wafer. The contents of Fe, Ni, Cr and Cu are made lower than 1.0 ppm respectively within a depth of at least 10 μm from surface in a plasma-resistant member.

12 Claims, No Drawings

PLASMA-RESISTANT MEMBER FOR SEMICONDUCTOR MANUFACTURING APPARATUS AND METHOD FOR MANUFACTURING THE SAME

BACKGROUND OF THE INVENTION

The present invention relates to a plasma-resistant member for a semiconductor manufacturing apparatus, such as a plasma vessel, a dome, a bell jar, a window material, or a dielectric plate in an apparatus for performing treatment with halide plasma of fluorine, chlorine or the like, for use in CVD, etching treatment, or the like, and a method for manufacturing the plasma-resistant member.

In the related art, as plasma-resistant members for a semiconductor manufacturing apparatus, plasma-resistant members made of high-purity alumina ceramics formed by sintering or firing, in the atmosphere, molded pieces obtained out of alumina ($Al_2O_3$) powder with a purity of at least 99.5% have been generally used. Further, when metal contamination becomes an issue, plasma-resistant members made of super-high-purity alumina ceramics formed by sintering or firing, in the atmosphere, molded pieces obtained out of alumina powder with a purity of at least 99.9% have been used.

On the other hand, in recent years, there are also known plasma-resistant members made of yttrium oxide ($Y_2O_3$) or yttrium aluminum garnet (YAG: $Y_3Al_5O_{12}$) ceramics having superior resistance against halide plasma to alumina ceramics.

However, according to the current 0.1 $\mu$m semiconductor design rule, metal contamination such as Fe (iron) or the like is generated in the conventional plasma-resistant members for a semiconductor manufacturing apparatus. Thus, there occurs disadvantageously a failure of semiconductor devices.

Incidentally, a desired level of Fe contamination in a semiconductor wafer is not higher than 1×10E10 ($1 \times 10^{10}$) atoms/$cm^2$ in the case of poly-Si etcher. It is considered that the reason why such a disadvantage occurs is that about 3–20 ppm metal impurities of Fe and so on have been already contained on the raw material level even in super-high-purity alumina powder having a purity of 99.99% industrially available at present.

Thus, in a surface layer of a plasma-resistant member made of high-purity alumina ceramics formed by sintering or firing, in the atmosphere, a molded piece obtained out of usual powder with a purity of at least 99.5%, Fe and so on contained in the raw material are contained as they are.

On the other hand, also in the case of a plasma-resistant member made of yttrium oxide and/or yttrium aluminum garnet ceramics, metal impurities have been already contained on the raw material level. Thus, contamination is caused on a semiconductor wafer in the same manner.

SUMMARY OF THE INVENTION

It is therefore an object of the invention to provide a plasma-resistant member for a semiconductor manufacturing apparatus in which the contamination level on a semiconductor wafer can be reduced, and to provide a method for manufacturing the plasma-resistant member.

In order to solve the foregoing problems, according to the invention, there is provided a plasma-resistant member for a semiconductor manufacturing apparatus, wherein contents of Fe, Ni, Cr and Cu are made lower than 1.0 ppm respectively within a depth of at least 10 $\mu$m from surface in the plasma-resistant member.

Alternatively, the plasma-resistant member may be made of yttrium oxide and/or yttrium aluminum garnet ceramics.

According to the invention, there is provided a first method for manufacturing a plasma-resistant member for a semiconductor manufacturing apparatus, comprising the step of: sintering or firing a molded piece at a temperature of 1650–2000° C. in a reductive atmosphere so as to form the molded piece into yttrium oxide and/or yttrium aluminum garnet ceramics.

Further, according to the invention, there is provided a fourth method for manufacturing a plasma-resistant member for a semiconductor manufacturing apparatus, comprising the steps of: roughening a surface of a sintered or fired piece made of yttrium oxide and/or yttrium aluminum garnet ceramics by one of machining and chemical etching; and heat-treating the surface-roughened sintered or fired piece at a temperature of 1650–2000° C. in a reductive atmosphere.

DETAILED DESCRIPTION OF THE PREFERRED EMBODIMENTS

In the plasma-resistant member for a semiconductor manufacturing apparatus, when the surface is exposed to halide plasma (including the case where halide gas coexists), the plasma-resistant member is etched from the surface gradually. However, when the plasma-resistant member is etched within a depth of at least 10 $\mu$m from the surface, the contamination with respective metal impurities satisfies the contamination level of 1E+10 ($1 \times 10^{10}$) or lower on a semiconductor wafer.

When the surface layer where the contents of respective metal impurities are lower than 1.0 ppm is thinner than 10 $\mu$m, the lifetime of the plasma-resistant member becomes short.

Though it is the most preferable that the contents of respective metal impurities are lower than 1.0 ppm all over the plasma-resistant member, in practice, it is difficult in terms of cost to do so. The thickness of the surface layer where the contents of respective metal impurities are lower than 1.0 ppm is more preferably 20 $\mu$m, and further preferably 50 $\mu$m.

Incidentally, though the etching rate with halide plasma varies in accordance with the conditions of the plasma, it is generally 0.01–0.1 $\mu$m/hr in the case of alumina, and it is generally 0.001–0.1 $\mu$m/hr in the case of yttrium oxide and/or yttrium aluminum garnet.

On the contrary, when the contents of respective metal impurities within a depth of at least 10 $\mu$m from the surface are not lower than 1.0 ppm, the contamination level on a semiconductor wafer exceeds 1E+10.

In the first method for manufacturing a plasma-resistant member for a semiconductor manufacturing apparatus, the contents of respective metal impurities become lower than 1.0 ppm within a depth of at least 10 $\mu$m from the surface.

A hydrogen gas atmosphere is used as the reductive atmosphere.

When the sintering or firing temperature is lower than 1650° C., the contents of respective metal impurities become not lower than 1.0 ppm within a depth of at least 10 $\mu$m from the surface. On the contrary, when the sintering or firing temperature exceeds 2000° C., a deficiency of strength of a sintered piece becomes conspicuous with the crystal grain growth. It is known that an yttrium oxide and/or yttrium aluminum garnet sintered piece is essentially low in strength. It is therefore necessary to pay attention particularly to this point. In addition, since yttrium aluminum garnet may be melt at a temperature of 1800° C. or higher, it is necessary to take care of this point.

The sintering or firing temperature is more preferably 1700–1900° C.

Further, in the second method for manufacturing a plasma-resistant member for a semiconductor manufacturing apparatus, the surface form is modified, and the contents of respective metal impurities become lower than 1.0 ppm within a depth of at least 10 μm from the surface.

As the machining, grinding with a diamond grindstone or the like, or sandblasting with diamond grains or the like is performed.

Hot sulfuric acid, hot phosphoric acid, or the like, is used for the chemical etching.

A hydrogen gas atmosphere is used as the reductive atmosphere.

When the heat treatment temperature is lower than 1,650° C., the contents of respective metal impurities become not lower than 1.0 ppm within a depth of at least 10 μm from the surface. On the contrary, when the heat treatment temperature exceeds 2000° C., a deficiency of strength of a sintered piece becomes conspicuous with the crystal grain growth. It is known that an yttrium oxide and/or yttrium aluminum garnet sintered piece is essentially low in strength. It is therefore necessary to pay attention particularly to this point. In addition, since yttrium aluminum garnet may be melt at a temperature of 1,800° C. or higher, it is necessary to take care of this point.

The heat treatment temperature is more preferably 1700–1900° C.

On the other hand, the average grain size of yttrium oxide and/or yttrium aluminum garnet used in the invention is preferably under 30 μm in the form of a sintered or fired piece.

By controlling the grain size thus, refinement can be performed efficiently.

When the grain size is too small, impurities is difficult to remove. On the contrary, when the grain size is too large, the strength is so weak that the amount of etching increases in the case where the yttrium oxide and/or yttrium aluminum garnet ceramics is used as a plasma-resistant member.

Incidentally, the surface roughness Ra of such yttrium oxide and/or yttrium aluminum garnet ceramics is preferably 0.6–2.0 μm because impurities are easy to remove.

In addition, it is preferable that the water absorption of the surface is not higher than 0.01%.

To facilitate the removal of impurities, it is advantageous that the content of gas of impurities such as Si and alkaline elements is smaller at the time of sintering or firing in the hydrogen gas atmosphere (or of heat treatment in the reductive atmosphere). It is particularly preferable that the impurity gas content in the hydrogen gas is not higher than 2 ppm.

When the content of such impurity elements increases, the surface of a sintered or fired piece is apt to have closed interstices so that the evaporation of the impurities is blocked.

The reduced content of impurities can result in a structure with a uniform crystal grain size.

Further, to facilitate the evaporation of transition metal such as Fe, it is preferable that the heating-up rate in the temperature range of 1200–1500° C. is set to be about 10–50° C./h so that heating-up is carried out gradually in the hydrogen gas.

In this range of temperature, the sintered or fired piece is porous. Thus, the hydrogen gas spreads all over the sintered or fired piece so as to perform reduction and facilitate the evaporation of the impurity metal.

In the temperature range of 1600° C. or higher, the sintered or fired piece is brought into a closed interstice form so that the impurity metal is evaporated only from the surface of the sintered or fired piece.

Embodiments of the invention will be described below with reference to its specific examples and comparative examples. Reference Example 1 and Comparative Example 1.

First, commercially available super-high-purity alumina (AKP-30 made by Sumitomo Chemical Co., Ltd.) having a purity of 99.99% and containing 10 ppm Fe as impurities was used as a starting material. Five hundred ppm MgO (magnesia) and 2 wt % of PVA (polyvinyl alcohol) as binder were added and mixed to the starting material, and granulated by use of a spray dryer.

Next, the obtained granulated powder was pressed and molded by use of a mold, and the molded piece was temporarily sintered or fired at a temperature of 1000° C. in the atmosphere, and then sintered or fire data temperature of 1700° C. (Comparative Example 1) and at a temperature of 1800° C. (Reference Example 1) in a hydrogen gas atmosphere. Thus, sintered or fired pieces of translucent alumina ceramics each formed into a dome 300 mm in diameter were obtained respectively.

In addition, at the same time, rectangular parallelepiped sintered or fired pieces each measuring 30 mm by 20 mm by 10 mm were produced as surface purity measuring samples respectively.

Both the surface purity measuring samples were etched with heated sulfuric acid in a closed Teflon vessel individually. When molten solutions sampled hourly were measured by an ICP emission spectrometer, the contents of metal impurities of Fe, Ni, Cr and Cu contained within respective depths from surface shown in Table 1 were obtained as shown in Table 1 respectively.

Incidentally, the depths from surface were calculated from the quantum of Al (aluminum) contained in the molten solutions.

On the other hand, both the dome-like sintered or fired pieces of translucent alumina ceramics were mounted on an ICP plasma apparatus individually. As gas, mixture gas of HBr (hydrogen bromide), $Cl_2$ (chlorine) and $O_2$ (oxygen) was supplied by 5 mTorr, and etching tests of Si (silicon) wafers were carried out with source power of 1000 W. Thus, the contamination levels on the Si wafers with the metal impurities of Fe, Ni, Cr and Cu were obtained as shown in Table 1, in which the contamination level of an untreated Si wafer is also shown.

Incidentally, the contamination levels of the Si wafers applied were analyzed by ICP-MAS.

TABLE 1

| | depth from surface | impurity concentration (ppm) | | | | wafer contamination (atoms/cm$^2$) | | | |
|---|---|---|---|---|---|---|---|---|---|
| | ($\mu$m) | Fe | Ni | Cr | Cu | Fe | Ni | Cr | Cu |
| Comparative Example 1 | −10 | 2 | <1 | 1 | <1 | 6.0E+09 | 7.0E+09 | 8.0E+09 | 4.7E+09 |
| | 10–50 | 8 | 1 | 1 | <1 | | | | |
| | 50–100 | 11 | 1 | 1 | <1 | | | | |
| Reference Example 1 | −10 | 0.5 | <1 | <1 | <1 | 4.0E+09 | 7.0E+09 | 4.0E+09 | 3.0E+09 |
| | 10–50 | 5 | <1 | <1 | <1 | | | | |
| | 50–100 | 11 | 1 | 1 | <1 | | | | |
| Comparative Example 2 | −10 | 12 | 1 | 2 | <1 | 3.6E+10 | 1.2E+10 | 2.5E+10 | 4.8E+09 |
| | 10–50 | 10 | 1 | 2 | <1 | | | | |
| Comparative Example 3 | −10 | 1.0 | <1 | 1 | <1 | 9.8E+09 | 7.0E+09 | 9.8E+09 | 3.0E+09 |
| | 10–50 | 9 | 1 | 2 | <1 | | | | |
| Reference Example 2 | −10 | 0.8 | <1 | <1 | <1 | 5.0E+09 | 7.0E+09 | 4.0E+09 | 3.0E+09 |
| | 10–50 | 10 | 1 | 2 | <1 | | | | |
| Comparative Example 4 | −10 | 40 | 2 | 1 | 2 | 4.5E+11 | 5.0E+10 | 3.5E+11 | 1.5E+11 |
| Si wafer (untreated) | — | — | — | — | — | 4.0E+09 | 7.0E+09 | 3.0E+09 | 3.0E+09 |

Comparative Example 2

The surface of the surface purity measuring sample in Reference Example 1 was ground to the depth of 1 mm from surface by use of a diamond grindstone. The contents of metal impurities of Fe, Ni, Cr and Cu contained within respective depths from surface shown in Table 1 were measured in the same manner as in Reference Example 1. The contents were obtained as shown in Table 1 respectively.

In addition, the surface of the dome-like plasma-resistant member made of translucent alumina ceramics in Reference Example 1 was ground to the depth of 1 mm from surface by use of a diamond grindstone. An etching test of an Si wafer was performed by use of the plasma-resistant member in the same manner as in Reference Example 1. Thus, the contamination levels on the Si wafer with the metal impurities of Fe, Ni, Cr and Cu were obtained as shown in Table 1.

Reference Example 2 and Comparative Example 3

The surface purity measuring sample in Comparative Example 2 was heat-treated at a temperature of 1700° C. (Comparative Example 3) and at a temperature of 1800° C. (Reference Example 2) in a hydrogen gas atmosphere. The contents of metal impurities of Fe, Ni, Cr and Cu contained within respective depths from surface shown in Table 1 were measured in the same manner as in Reference Example 1. The contents were obtained as shown in Table 1 respectively.

In addition, the dome-like plasma-resistant member made of translucent alumina ceramics in Comparative Example 2 was heat-treated at a temperature of 1700° C. (Comparative Example 3) and at a temperature of 1800° C. (Reference Example 2) in a hydrogen gas atmosphere. Etching tests of Si wafers were performed by use of these plasma-resistant members in the same manner as in Reference Example 1. Thus, the contamination levels on the Si wafers with the metal impurities of Fe, Ni, Cr and Cu were obtained as shown in Table 1.

Comparative Example 4

First, commercially available alumina (made by Sumitomo Chemical Co., Ltd.) having a purity of 99.5% and containing 45 ppm Fe as impurities was used as a starting material. Two wt % of PVA as binder were added and mixed to the starting material, and granulated by use of a spray dryer.

Next, the obtained granulated powder was pressed and molded by use of a mold. The molded piece was sintered or fired at a temperature of 1700° C. in the atmosphere. Thus, a sintered or fired piece of alumina ceramics formed into a dome 300 mm in diameter was obtained.

In addition, at the same time, a rectangular parallelepiped sintered or fired piece measuring 30 mm by 20 mm by 10 mm was produced as a surface purity measuring sample.

The contents of metal impurities of Fe, Ni, Cr and Cu contained within the depth of 10 $\mu$m from surface were measured in the surface purity measuring sample in the same manner as in Reference Example 1. Thus, the contents were obtained as shown in Table 1 respectively.

In addition, by use of the dome-like plasma-resistant member made of alumina ceramics, an etching test of an Si wafer was performed in the same manner as in Reference Example 1. Thus, the contamination levels on the Si wafer with the metal impurities of Fe, Ni, Cr and Cu were obtained as shown in Table 1.

As is understood from Table 1, the contamination level on the Si wafer becomes not higher than 1E+10 by use of a plasma-resistant member sintered or fired at a temperature of at least 1720° C. in a hydrogen gas atmosphere and made of translucent alumina ceramics, or a plasma-resistant member which is sintered or fired at a temperature of at least 1720° C. in a hydrogen gas atmosphere, then subjected to surface-machining, and then heat-treated at a temperature of at least 1720° C. in a hydrogen gas atmosphere, and which is made of translucent alumina ceramics.

Example 1

First, yttrium oxide (yttria: $Y_2O_3$) powder having a purity of 99.9% and containing about 10 ppm Fe as impurities and commercially available high-purity alumina (AKP-30 made by Sumitomo Chemical Co., Ltd.) powder having a purity of 99.99% and containing 10 ppm Fe as impurities were mixed to have a composition of yttrium aluminum garnet. The obtained powder mixture was used as a starting material. Two wt % of PVA as binder were added and mixed to the starting material, and granulated by use of a spray dryer.

Next, the obtained granulated powder was pressed and molded by use of a mold, and the molded piece was temporarily sintered or fired at a temperature of 1000° C. in the atmosphere, and then sintered or fired at a temperature of 1700° C. in a hydrogen gas atmosphere. Thus, a sintered or fired piece of yttrium aluminum garnet ceramics formed into a dome 300 mm in diameter was obtained.

In addition, a rectangular parallelepiped sintered or fired piece measuring 30 mm by 20 mm by 10 mm was produced as a surface purity measuring sample.

The contents of metal impurities of Fe, Ni, Cr and Cu contained within respective depths from surface shown in Table 2 were measured in the surface purity measuring sample in the same manner as in Reference Example 1. Thus, the contents were obtained as shown in Table 2 respectively.

In addition, by use of the dome-like plasma-resistant member made of yttrium aluminum garnet ceramics, an etching test of an Si wafer was performed in the same manner as in Reference Example 1. Thus, the contamination levels on the Si wafer with the metal impurities of Fe, Ni, Cr and Cu were obtained as shown in Table 2, in which the contamination level of an untreated Si wafer was also shown.

In addition, by use of the dome-like plasma-resistant member made of yttrium oxide ceramics, an etching test of an Si wafer was performed in the same manner as in Reference Example 1. Thus, the contamination levels on the Si wafer with the metal impurities of Fe, Ni, Cr and Cu were obtained as shown in Table 2.

Comparative Example 6

The surface of the surface purity measuring sample in Example 1 was ground to the depth of 1 mm from surface by use of a diamond grindstone. The contents of metal impurities of Fe, Ni, Cr and Cu contained within respective depths from the surface shown in Table 2 were measured in the same manner as in Reference Example 1. The contents were obtained as shown in Table 2 respectively.

In addition, the surface of the dome-like plasma-resistant member made of yttrium aluminum garnet ceramics in Example 1 was ground to the depth of 1 mm from surface by use of a diamond grindstone. An etching test of an Si wafer was performed by use of the plasma-resistant member in the same manner as in Reference Example 1. Thus, the

TABLE 2

|  | depth from surface | impurity concentration (ppm) | | | | wafer contamination (atoms/cm$^2$) | | | |
| --- | --- | --- | --- | --- | --- | --- | --- | --- | --- |
|  | (μm) | Fe | Ni | Cr | Cu | Fe | Ni | Cr | Cu |
| Comparative Example 5 | −10 | 2 | <1 | 1 | <1 | 6.0E+09 | 7.0E+09 | 8.0E+09 | 5.0E+09 |
|  | 10–50 | 8 | 1 | 1 | <1 |  |  |  |  |
|  | 50–100 | 13 | 3 | 1 | <1 |  |  |  |  |
| Example 1 | −10 | 0.7 | <1 | <1 | <1 | 6.5E+09 | 6.5E+09 | 3.0E+09 | 3.0E+09 |
|  | 10–50 | 8 | <1 | <1 | <1 |  |  |  |  |
|  | 50–100 | 14 | 1 | 1 | <1 |  |  |  |  |
| Comparative Example 6 | −10 | 13 | <1 | <1 | <1 | 7.0E+10 | 1.0E+10 | 2.0E+10 | 7.0E+09 |
|  | 10–50 | 15 | 1 | <1 | <1 |  |  |  |  |
| Example 2 | −10 | 0.9 | <1 | <1 | <1 | 7.0E+09 | 6.0E+09 | 4.0E+09 | 3.5E+09 |
|  | 10–50 | 8 | 1 | <1 | <1 |  |  |  |  |
| Comparative Example 7 | −10 | 8 | 2 | 1 | 1 | 2.0E+11 | 3.0E+10 | 4.0E+10 | 9.0E+09 |
|  | 10–50 | 9 | 1 | 1 | <1 |  |  |  |  |
| Comparative Example 8 | −10 | 1 | <1 | 1 | <1 | 4.5E+11 | 5.0E+10 | 3.5E+11 | 1.5E+11 |
|  | 10–50 | 8 | 1 | 1 | <1 |  |  |  |  |
| Comparative Example 9 | −10 | 2 | <1 | 1 | <1 | 7.0E+09 | 6.0E+09 | 8.0E+09 | 4.6E+09 |
|  | 10–50 | 10 | 2 | 1 | <1 |  |  |  |  |
| Si wafer (untreated) | — | — | — | — | — | 4.0E+09 | 7.0E+09 | 3.0E+09 | 3.0E+09 |

Comparative Example 5

First, yttrium oxide powder having a purity of 99.9% and containing about 10 ppm Fe as impurities was used as a starting material. Two wt % of PVA as binder were added and mixed to the starting material, and granulated by use of a spray dryer.

Next, the obtained granulated powder was pressed and molded by use of a mold, and the molded piece was temporarily sintered or fired at a temperature of 1000° C. in the atmosphere, and then sintered or fired at a temperature of 1,600° C. in a hydrogen gas atmosphere. Thus, a sintered or fired piece of yttrium oxide ceramics formed into a dome 300 mm in diameter was obtained.

In addition, a rectangular parallelepiped sintered or fired piece measuring 30 mm by 20 mm by 10 mm was also produced as a surface purity measuring sample.

The contents of metal impurities of Fe, Ni, Cr and Cu contained within respective depths from surface shown in Table 2 were measured in the surface purity measuring sample in the same manner as in Reference Example 1. Thus, the contents were obtained as shown in Table 2 respectively.

contamination levels on the Si wafer with the metal impurities of Fe, Ni, Cr and Cu were obtained as shown in Table 2.

Example 2

The surface purity measuring sample in Comparative Example 6 was heat-treated at a temperature of 1,780° C. in a hydrogen gas atmosphere. The contents of metal impurities of Fe, Ni, Cr and Cu contained within respective depths from surface shown in Table 2 were measured in the same manner as in Reference Example 1. The contents were obtained as shown in Table 2 respectively.

In addition, the dome-like plasma-resistant member made of yttrium aluminum garnet ceramics in Comparative Example 6 was heat-treated at a temperature of 1780° C. in a hydrogen gas atmosphere. An etching test of an Si wafer was performed by use of the plasma-resistant member in the same manner as in Reference Example 1. Thus, the contamination levels on the Si wafer with the metal impurities of Fe, Ni, Cr and Cu were obtained as shown in Table 2.

Comparative Example 7

The surface of the surface purity measuring sample in Example 1 was sandblasted to the depth of 1 mm from surface by use of diamond grains. The contents of metal impurities of Fe, Ni, Cr and Cu contained within respective depths from the surface shown in Table 2 were measured in the same manner as in Reference Example 1. The contents were obtained as shown in Table 2 respectively.

In addition, the surface of the dome-like plasma-resistant member made of yttrium aluminum garnet ceramics in Example 1 was sandblasted to the depth of 1 mm from surface by use of diamond grains. An etching test of an Si wafer was performed by use of the plasma-resistant member in the same manner as in Reference Example 1. Thus, the contamination levels on the Si wafer with the metal impurities of Fe, Ni, Cr and Cu were obtained as shown in Table 2.

Comparative Example 8

The surface purity-measuring sample in Comparative Example 7 was heat-treated at a temperature of 1,600° C. in a hydrogen gas atmosphere. The contents of metal impurities of Fe, Ni, Cr and Cu contained within respective depths from surface shown in Table 2 were measured in the same manner as in Reference Example 1. The contents were obtained as shown in Table 2 respectively.

In addition, the dome-like plasma-resistant member made of yttrium aluminum garnet ceramics in Comparative Example 7 was heat-treated at a temperature of 1600° C. in a hydrogen gas atmosphere. An etching test of an Si wafer was performed by use of the plasma-resistant member in the same manner as in Reference Example 1. Thus, the contamination levels on the Si wafer with the metal impurities of Fe, Ni, Cr and Cu were obtained as shown in Table 2.

Comparative Example 9

First, yttrium oxide powder having a purity of 99.9% and containing about 10 ppm Fe as impurities, and commercially available high-purity alumina (AKP-30 made by Sumitomo Chemical Co., Ltd.) powder having a purity of 99.99% and containing 10 ppm Fe as impurities were mixed to have a mixed composition of yttrium oxide and yttrium aluminum garnet. The obtained powder mixture was used as a starting material. Two wt % of PVA as binder were added and mixed to the starting material, and granulated by use of a spray dryer.

Next, the obtained granulated powder was pressed and molded by use of a mold, and the molded piece was temporarily sintered or fired at a temperature of 1000° C. in the atmosphere, and then sintered or fired at a temperature of 1600° C. in a hydrogen gas atmosphere. Thus, a sintered or fired piece of yttrium oxide and yttrium aluminum garnet ceramics formed into a dome 300 mm in diameter was obtained.

In addition, a rectangular parallelepiped sintered or fired piece measuring 30 mm by 20 mm by 10 mm was also produced as a surface purity measuring sample.

The contents of metal impurities of Fe, Ni, Cr and Cu contained within respective depths from surface shown in Table 2 were measured in the surface purity measuring sample in the same manner as in Reference Example 1. Thus, the contents were obtained as shown in Table 2 respectively.

In addition, by use of the dome-like plasma-resistant member made of yttrium oxide and yttrium aluminum garnet ceramics, an etching test of an Si wafer was performed in the same manner as in Reference Example 1. Thus, the contamination levels on the Si wafer with the metal impurities of Fe, Ni, Cr and Cu were obtained as shown in Table 2.

As is understood from Table 2, the contamination level on the Si wafer becomes not higher than 1E+10 by use of a plasma-resistant member sintered or fired at a temperature of at least 1650° C. in a hydrogen gas atmosphere and made of yttrium oxide and/or yttrium aluminum garnet ceramics, or a plasma-resistant member which is sintered or fired at a temperature of at least 1650° C. in a hydrogen gas atmosphere, then subjected to machining such as grinding or sandblasting in the surface, and then heat-treated at a temperature of at least 1650° C. in a hydrogen gas atmosphere, and which is made of yttrium oxide and/or yttrium aluminum garnet ceramics.

Incidentally, although description in the Examples and Comparative Examples has been made on plasma-resistant members made of translucent alumina ceramics or yttrium oxide and/or yttrium aluminum garnet ceramics, the invention is not limited thereto. For example, plasma-resistant members may be made of ceramics having rare earth elements other than yttrium as their chief components, or ceramics made of fluoride of alkaline earth metal such as $CaF_2$ or $HgF_2$.

Further, not to say, the treatment for roughening the surface of a sintered or fired piece may be performed by chemical etching instead of machining.

As described above, according to a plasma-resistant member for a semiconductor manufacturing apparatus and a method for manufacturing the same according to the invention, the surface is etched gradually if the surface is exposed to halide plasma. However, within a depth of at least 10 μm from surface, the contaminations with respective metal impurities satisfy the contamination level not higher than 1E+10 on a semiconductor wafer. Thus, the contamination level on the semiconductor wafer can be reduced sufficiently in comparison with that in the related art.

What is claimed is:

1. A plasma-resistant member for a semiconductor manufacturing apparatus, wherein the concentrations of Fe, Ni, Cr and Cu impurities are each lower than 1.0 ppm within a depth of at least 10 μm from the surface in said plasma-resistant member, and wherein said plasma-resistant member comprises yttrium oxide and/or yttrium aluminum garnet ceramics.

2. The plasma resistant member according to claim 1, wherein said depth is at least 20 μm.

3. The plasma resistant member according to claim 2, wherein said depth is at least 50 μm.

4. The plasma resistant member according to claim 1, wherein said plasma-resistant member comprises yttrium oxide and yttrium aluminum garnet ceramics.

5. A plasma-resistant member for a semiconductor manufacturing apparatus, wherein the concentrations of Fe, Ni, Cr and Cu impurities are each lower than 1.0 ppm within a depth of at least 10 μm from the surface in said plasma-resistant member, and wherein said plasma-resistant member comprises a ceramic of one or more rare earth elements, one or more alkaline earth elements, or alumina.

6. The plasma-resistant member according to claim 5, wherein the ceramic comprises alumina.

7. The plasma-resistant member according to claim 5, wherein the ceramic comprises one or more rare earth elements.

8. The plasma-resistant member according to claim 5, wherein the ceramic comprises one or more alkaline earth elements.

9. The plasma-resistant member according to claim 8, wherein the alkaline earth elements are present as their fluoride salts.

10. The plasma-resistant member according to claim 9, wherein the fluoride salt is $CaF_2$.

11. The plasma resistant member according to claim 5, wherein said depth is at least 20 $\mu$m.

12. The plasma resistant member according to claim 11, wherein said depth is at least 50 $\mu$m.

* * * * *